(12) United States Patent
Spoonhower et al.

(10) Patent No.: US 6,853,660 B2
(45) Date of Patent: *Feb. 8, 2005

(54) ORGANIC LASER CAVITY ARRAYS

(75) Inventors: John P. Spoonhower, Webster, NY (US); Joseph A. Manico, Rochester, NY (US); Edward Covannon, Ontario, NY (US); David L. Patton, Webster, NY (US)

(73) Assignee: Eastman Kodak Company, Rochester, NY (US)

( * ) Notice: Subject to any disclaimer, the term of this patent is extended or adjusted under 35 U.S.C. 154(b) by 40 days.

This patent is subject to a terminal disclaimer.

(21) Appl. No.: 10/272,093

(22) Filed: Oct. 16, 2002

(65) Prior Publication Data

US 2004/0076201 A1 Apr. 22, 2004

(51) Int. Cl.[7] .............................. H01S 3/14; H01S 3/08
(52) U.S. Cl. ............................................ 372/39; 372/96
(58) Field of Search .............................. 372/39, 96, 99, 372/70; 428/690

(56) References Cited

U.S. PATENT DOCUMENTS

| | | | | |
|---|---|---|---|---|
| 5,115,336 A | * | 5/1992 | Schildkraut et al. | 359/263 |
| 5,707,745 A | * | 1/1998 | Forrest et al. | 428/432 |
| 5,881,083 A | | 3/1999 | Diaz-Garcia et al. | |
| 5,881,089 A | | 3/1999 | Berggren et al. | |
| 6,111,902 A | * | 8/2000 | Kozlov et al. | 372/39 |
| 6,160,828 A | * | 12/2000 | Kozlov et al. | 372/39 |
| 6,194,119 B1 | | 2/2001 | Wolk et al. | |
| 6,214,520 B1 | * | 4/2001 | Wolk et al. | 430/273.1 |
| 6,658,037 B2 | * | 12/2003 | Kahen et al. | 372/70 |
| 6,674,776 B2 | * | 1/2004 | Kahen et al. | 372/39 |
| 6,687,274 B2 | * | 2/2004 | Kahen | 372/39 |
| 6,690,697 B1 | * | 2/2004 | Kahen | 372/39 |
| 2002/0197456 A1 | * | 12/2002 | Pope | 428/209 |
| 2003/0161368 A1 | * | 8/2003 | Kahen et al. | 372/39 |
| 2003/0219058 A1 | * | 11/2003 | Kahen et al. | 372/96 |

OTHER PUBLICATIONS

Kinoshita et al., Circular Buried Heterostructure (CBH) GaAlAs/GaAs Surface Emitting Lasers, IEEE Journal of Quantum Electronics, vol. QE–23, No. 6, Jun. 1987, pp. 882–888.

Choquette, et al., Vertical–Cavity Surface Emitting Lasers: Moving from Research to Manufacturing, Proceedings of the IEEE, vol. 85, No. 11, Nov. 1997, pp. 1730–1739.

Wilmsen, et al., Vertical–Cavity Surface–Emitting Lasers, Cambridge University Press, 1999.

Ishigure, et al., Electronics Letters, Mar. 16th, 1995, vol. 31, No. 6, pp. 467–469.

Kranzelbinder, et al., Organic solid–state lasers, Rep. Prog. Phys. 63 (2000) 729–762.

Kozlov, et al., Study of lasing action based on Forster energy transfer in optically pumped organic semiconductor thin films, Journal of Applied Physics, vol. 84, No. 8, Oct. 15, 1998, pp. 4096–4106.

(List continued on next page.)

Primary Examiner—Don Wong
Assistant Examiner—Hung Tran Vy
(74) Attorney, Agent, or Firm—Stephen H. Shaw

(57) ABSTRACT

An organic laser cavity structure is described, comprising a plurality of organic laser cavity devices, each organic laser cavity device characterized by: i) a first dielectric stack for receiving and transmitting pump beam light and being reflective to laser light over a predetermined range of wavelengths; ii) an organic active region for receiving transmitted pump beam light from the first dielectric stack and for emitting light; iii) a second dielectric stack for reflecting transmitted pump beam light and laser light from the organic active region back into the organic active region, wherein a combination of the first and second dielectric stacks and the organic active region produces the laser light; and a predetermined arrangement of the plurality of organic laser cavity devices, such that a desired laser output is obtained.

61 Claims, 7 Drawing Sheets

OTHER PUBLICATIONS

Tessler, et al., Pulsed excitation of low–mobility light–emitting diodes: Implication for organic lasers, Applied Physics Letters, vol. 74, No. 19, May 10, 1999, pp. 2764–2766.

Berggren, et al., Light amplification in organic thin films using cascade energy transfer, Letters to Nature, vol. 389, Oct. 2, 1997, pp. 466–469.

Tessler, et al., HighPeak Brightness Polymer Light–Emitting Diodes, Advanced Materials, 1998, 10, No. 1, pp. 64–67.

Schon, et al., An Organic Solid State Injection Laser, Science, vol. 289, Jul. 28, 2000, pp. 599–601.

McGehee, et al., Semiconducting polymer distributed feedback lasers, Applied Physics Letters, vol. 72, No. 13, Mar. 30, 1998, pp. 1536–1538.

Corzine, et al., Design of Fabry–Perot Surface–Emitting Lasers with a Periodic Gain Structure, IEEE Journal of Quantum Electronics, vol. 25, No. 6, Jun. 1989, pp. 1513–1524.

U.S. Appl. No. 10/066,936, filed Feb. 4, 2002, Keith B. Kahen et al.

U.S. Appl. No. 10/066,829, filed Feb. 4, 2002, Keith B. Kahen.

U.S. Appl. No. 09/832,759, filed Apr. 11, 2001, Keith B. Kahen et al.

* cited by examiner

ORGANIC LASER CAVITY ARRAYS

CROSS-REFERENCE TO RELATED APPLICATIONS

Reference is made to commonly assigned U.S. patent application Ser. No. 09/832,759 filed Apr. 11, 2001 U.S. Pat. No. 6,658,037 entitled "Incoherent Light-Emitting Device Apparatus for Driving Vertical Laser Cavity" by Keith B. Kahen et al.; commonly assigned U.S. patent application Ser. No. 10/066,936 filed Feb. 04, 2002 now U.S. Pat. No. 6,674,776 entitled "Organic Vertical Cavity Lasing Devices Containing Periodic Gain Regions" by Keith B. Kahen et al.; and commonly assigned U.S. patent application Ser. No. 10/066,829 filed Feb. 4, 2002 now U.S. Pat. No. 6,687,274 entitled "Organic Vertical Cavity Phase-Locked Laser Array Device" by Keith B. Kahen, the disclosures of which are incorporated herein by reference.

FIELD OF THE INVENTION

The invention relates generally to the field of Vertical Cavity Surface Emitting Lasers (VCSELs) or microcavity lasers, and in particular to organic microcavity lasers or organic VCSELS. More specifically, the invention relates to the various arrays of organic laser cavities.

BACKGROUND OF THE INVENTION

Vertical cavity surface emitting lasers (VCSELs) based on inorganic semiconductors (e.g. AlGaAs) have been developed since the mid-80's (Kinoshita et al., IEEE Journal of Quantum Electronics, Vol. QE-23, No. 6, June 1987). They have reached the point where AlGaAs-based VCSELs emitting at 850 nm are manufactured by a number of companies and have lifetimes beyond 100 years (Choquette et al., Proceedings of the IEEE, Vol. 85, No. 11, November 1997). With the success of these near-infrared lasers, attention in recent years has turned to other inorganic material systems to produce VCSELs emitting in the visible wavelength range (Wilmsen, *Vertical-Cavity Surface-Emitting Lasers*, Cambridge University Press, Cambridge, 2001). There are many potential applications for visible lasers, such as, display, optical storage reading/writing, laser printing, and short-haul telecommunications employing plastic optical fibers (Ishigure et al., Electronics Letters, 16$^{th}$ March 1995, Vol. 31, No. 6). In spite of the worldwide efforts of many industrial and academic laboratories, much work remains to be done to create viable laser diodes (either edge emitters or VCSELs) that produce light output that spans the visible spectrum.

In an effort to produce visible wavelength VCSELs it would be advantageous to abandon inorganic-based systems and focus on organic-based laser systems, since organic-based gain materials can enjoy a number of advantages over inorganic-based gain materials in the visible spectrum. For example, typical organic-based gain materials have the properties of low unpumped scattering/absorption losses and high quantum efficiencies. In comparison to inorganic laser systems, organic lasers are relatively inexpensive to manufacture, can be made to emit over the entire visible range, can be scaled to arbitrary size and, most importantly, are able to emit multiple wavelengths (such as red, green, and blue) from a single chip. Over the past number of years, there has been increasing interest in making organic-based solid-state lasers. The laser gain material has been either polymeric or small molecule and a number of different resonant cavity structures were employed, such as, microcavity (Kozlov et al., U.S. Pat. No. 6,160,828, issued Dec. 12, 2000), waveguide, ring microlasers, and distributed feedback (see also, for instance, Kranzelbinder et al., Rep. Prog. Phys. 63, (2000) 729–762 and Diaz-Garcia et al., U.S. Pat. No. 5,881,083, issued Mar. 9, 1999). A problem with all of these structures is that in order to achieve lasing it was necessary to excite the cavities by optical pumping using another laser source. It is much preferred to electrically pump the laser cavities since this generally results in more compact and easier to modulate structures.

A main barrier to achieving electrically pumped organic lasers is the small carrier mobility of organic material, which is typically on the order of $10^{-5}$ cm$^2$/(V–s). This low carrier mobility results in a number of problems. Devices with low carrier mobilities are typically restricted to using thin layers in order to avoid large voltage drops and ohmic heating. These thin layers result in the lasing mode penetrating into the lossy cathode and anode, which causes a large increase in the lasing threshold (Kozlov et al., Journal of Applied Physics, Volume 84, No. 8, Oct. 15, 1998). Since electron-hole recombination in organic materials is governed by Langevin recombination (whose rate scales as the carrier mobility), low carrier mobilities result in orders of magnitude having more charge carriers than singlet excitons; one of the consequences of this is that charge-induced (polaron) absorption can become a significant loss mechanism (Tessler et al., Applied Physics Letters, Volume 74, Number 19, May 10, 1999). Assuming laser devices have a 5% internal quantum efficiency, using the lowest reported lasing threshold to date of ~100 W/cm$^2$ (Berggren et al., Letters to Nature, Volume 389, page 466, Oct. 2, 1997), and ignoring the above mentioned loss mechanisms, would put a lower limit on the electrically-pumped lasing threshold of 1000 A/cm$^2$. Including these loss mechanisms would place the lasing threshold well above 1000 A/cm$^2$, which to date is the highest reported current density, which can be supported by organic devices (Tessler, Advanced Materials, 1998, 10, No. 1, page 64).

One way to avoid these difficulties is to use crystalline organic material instead of amorphous organic material as the lasing media. This approach was recently taken (Schon, Science, Volume 289, Jul. 28, 2000) where a Fabry-Perot resonator was constructed using single crystal tetracene as the gain material. By using crystalline tetracene, larger current densities can be obtained, thicker layers can be employed (since the carrier mobilities are on the order of 2 cm$^2$/(V–s)), and polaron absorption is much lower. Using crystal tetracene as the gain material, resulted in room temperature laser threshold current densities of approximately 1500 A/cm$^2$.

An alternative to electrical pumping for organic lasers is optical pumping by incoherent light sources, such as, light emitting diodes (LEDs), either inorganic (McGehee et al., Applied Physics Letters, Volume 72, Number 13, Mar. 30, 1998) or organic (Berggren et al., U.S. Pat. No. 5,881,089, issued Mar. 9, 1999). This possibility is the result of unpumped organic laser systems having greatly reduced combined scattering and absorption losses (~0.5 cm$^{-1}$) at the lasing wavelength, especially when one employs a host-dopant combination as the active media. Even taking advantage of these small losses, the smallest reported optically pumped threshold for organic lasers to date is 100 W/cm$^2$ based on a waveguide laser design (Berggren et al., Letters to Nature Volume 389, Oct. 2, 1997). Since off-the-shelf inorganic LEDs can only provide up to ~20 W/cm$^2$ of power density, it is necessary to take a different route to avail of optically pumping by incoherent sources. Additionally, in order to lower the lasing threshold it is necessary to choose a laser structure that minimizes the gain volume; a VCSEL-based microcavity laser satisfies this criterion. Using VCSEL-based organic laser cavities should enable optically pumped power density thresholds below 5 W/cm². As a result practical organic laser devices can be driven by optically pumping with a variety of readily available, incoherent light sources, such as LEDs.

There are a few disadvantages to organic-based gain media, but with careful laser system design these can be overcome. Organic materials can suffer from low optical and thermal damage thresholds. Devices will have a limited pump power density in order to preclude irreversible damage to the device. Organic materials additionally are sensitive to a variety of environmental factors, like oxygen and water vapor. Efforts to reduce sensitivity to these variables typically result in increased device lifetime.

One of the advantages of organic-based lasers is that since the gain material is typically amorphous, devices can be formed inexpensively when compared to lasers with gain materials that require a high degree of crystallinity (either inorganic or organic materials). Additionally, lasers based upon organic amorphous gain materials can be fabricated over large areas without regard to producing large regions of single crystalline material; as a result they can be scaled to arbitrary size resulting in greater output powers. Because of their amorphous nature, organic-based lasers can be grown on a wide variety of substrates; thus, materials such as glass, flexible plastics, and Si are possible supports for these devices. Thus, there can be significant cost advantages as well as a greater choice in usable support materials for amorphous organic-based lasers.

SUMMARY OF THE INVENTION

The present invention is directed to overcoming one or more of the problems set forth above. Briefly summarized, according to one aspect of the present invention, an organic laser cavity structure is described, comprising:
   a) a plurality of organic laser cavity devices, each organic laser cavity device characterized by:
      i) a first dielectric stack for receiving and transmitting pump beam light and being reflective to laser light over a predetermined range of wavelengths;
      ii) an organic active region for receiving transmitted pump beam light from the first dielectric stack and for emitting light;
      iii) a second dielectric stack for reflecting transmitted pump beam light and laser light from the organic active region back into the organic active region, wherein a combination of the first and second dielectric stacks and the organic active region produces the laser light; and
   b) a predetermined arrangement of the plurality of organic laser cavity devices, such that a desired laser output is obtained for a number of applications.

One advantage of the organic laser cavity devices is that they can be easily fabricated into arrays of individually addressable elements at low cost. In such arrays, each element could be incoherent with neighboring elements and pumped by a separate pump source (e.g. LED or group of LEDs). The arrays could either be one-dimensional (linear) or two-dimensional (area) depending on the requirements of the application. The elements in the array can also comprise multiple host-donor combinations and/or multiple cavity designs such that a number of wavelengths could be produced by a single array. Additionally, organic laser cavity devices can be fabricated into large area structures as there are no requirements on the support for single crystallinity as is typical for inorganic VCSEL devices.

BRIEF DESCRIPTION OF THE DRAWINGS

The above and other objects, features, and advantages of the present invention will become more apparent when taken in conjunction with the following description and drawings wherein identical reference numerals have been used, where possible, to designate identical features that are common to the figures, and wherein.

To facilitate understanding, identical reference numerals have been used, where possible, to designate identical elements that are common to the figures.

DETAILED DESCRIPTION OF THE INVENTION

In the present invention, the terminology describing vertical cavity organic laser devices (VCSELs) may be used interchangeably in a short hand fashion as "organic laser cavity devices." Organic laser cavity structures are fabricated as large area structures and optically pumped with light emitting diodes (LEDs).

Figure 1:
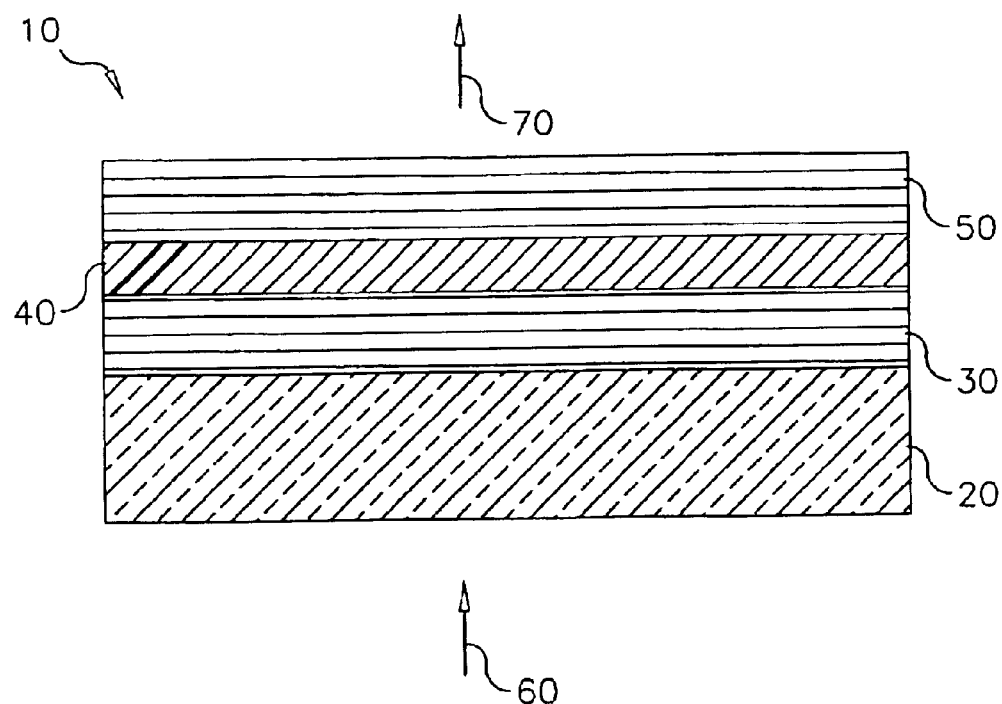
FIG. 1 is a cross-section side view schematic of an optically pumped organic laser cavity device.

A schematic of a vertical cavity organic laser device 10 is shown in FIG. 1. The substrate 20 can either be light transmissive or opaque, depending on the intended direction of optical pumping and laser emission. Light transmissive substrates 20 may be transparent glass, plastic, or other transparent materials such as sapphire. Alternatively, opaque substrates including, but not limited to, semiconductor material (e.g. silicon) or ceramic material may be used in the case where both optical pumping and emission occur through the same surface. On the substrate is deposited a bottom dielectric stack 30 followed by an organic active region 40. A top dielectric stack 50 is then deposited. A pump beam 60 optically pumps the vertical cavity organic laser device 10. The source of the pump beam 60 may be incoherent, such as emission from a light-emitting diode (LED). Alternatively, the pump beam 60 may originate from a coherent laser source. FIG. 1 shows laser emission 70 from the top dielectric stack 50. Alternatively, the laser device could be optically pumped through the top dielectric stack 50 with the laser emission through the substrate 20 by proper design of the dielectric stack reflectivities. In the case of an opaque substrate, such as silicon, both optical pumping and laser emission occur through the top dielectric stack 50.

The preferred material for the organic active region 40 is a small-molecular weight organic host-dopant combination typically deposited by high-vacuum thermal evaporation. These host-dopant combinations are advantageous since they result in very small unpumped scattering/absorption losses for the gain media. It is preferred that the organic molecules be of small molecular weight since vacuum deposited materials can be deposited more uniformly than spin-coated polymeric materials. It is also preferred that the host materials used in the present invention are selected such that they have sufficient absorption of the pump beam 60 and are able to transfer a large percentage of their excitation energy to a dopant material via Förster energy transfer. Those skilled in the art are familiar with the concept of Förster energy transfer, which involves a radiationless transfer of energy between the host and dopant molecules. An example of a useful host-dopant combination for red-emitting lasers is aluminum tris(8-hydroxyquinoline) (Alq) as the host and [4-(dicyanomethylene)-2-t-butyl-6-(1,1,7,7-tetramethyljulolidyl-9-enyl)-4H-pyran] (DCJTB) as the dopant (at a volume fraction of 1%). Other host-dopant combinations can be used for other wavelength emissions. For example, in the green a useful combination is Alq as the host and [10-(2-benzothiazolyl)-2,3,6,7-tetrahydro-1,1,7,7-tetramethyl-1H,5H,11H-[1]Benzopyrano[6,7,8-ij]quinolizin-11-one] (C545T) as the dopant (at a volume fraction of 0.5%). Other organic gain region materials can be polymeric substances, e.g., polyphenylenevinylene derivatives, dialkoxy-polyphenylenevinylenes, poly-para-phenylene derivatives, and polyfluorene derivatives, as taught by Wolk et al. in commonly assigned U.S. Pat. No. 6,194,119 B1, issued Feb. 27, 2001, and referenced herein. It is the purpose of the organic active region 40 to receive transmitted pump beam light 60 and emit laser light.

The bottom and top dielectric stacks 30 and 50, respectively, are preferably deposited by conventional electron-beam deposition and can comprise alternating high index and low index dielectric materials, such as, $TiO_2$ and $SiO_2$, respectively. Other materials, such as $Ta_2O_5$ for the high index layers, could be used. The bottom dielectric stack 30 is deposited at a temperature of approximately 240° C. During the top dielectric stack 50 deposition process, the temperature is maintained at around 70° C. to avoid melting the organic active materials. In an alternative embodiment of the present invention, the top dielectric stack is replaced by the deposition of a reflective metal mirror layer. Typical metals are silver or aluminum, which have reflectivities in excess of 90%. In this alternative embodiment, both the pump beam 60 and the laser emission 70 would proceed through the substrate 20. Both the bottom dielectric stack 30 and the top dielectric stack 50 are reflective to laser light over a predetermined range of wavelengths, in accordance with the desired emission wavelength of the laser cavity 10.

The use of a vertical microcavity with very high finesse allows a lasing transition at a very low threshold (below 0.1 $W/cm^2$ power density). This low threshold enables incoherent optical sources to be used for the pumping instead of the focused output of laser diodes, which is conventionally used in other laser systems. An example of a pump source is a UV LED, or an array of UV LEDs, e.g. from Cree (specifically, the XBRIGHT® 900 UltraViolet Power Chip® LEDs). These sources emit light centered near 405 nm wavelength and are known to produce power densities on the order of 20 $W/cm^2$ in chip form. Thus, even taking into account limitations in utilization efficiency due to device packaging and the extended angular emission profile of the LEDs, the LED brightness is sufficient to pump the laser cavity at a level many times above the lasing threshold.

Figure 2:
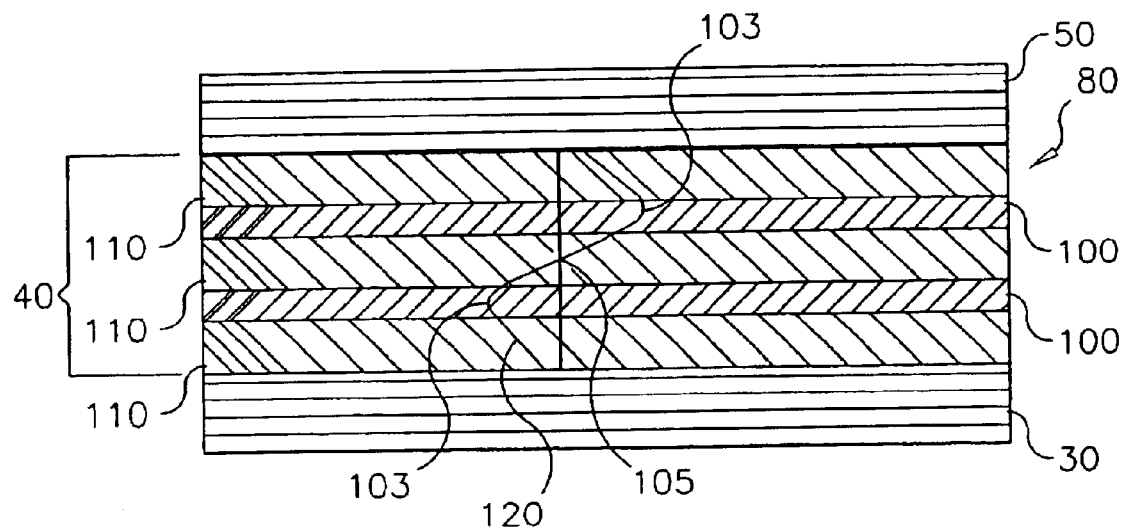
FIG. 2 is a cross-section side view schematic of an optically pumped organic-based vertical cavity laser with a periodically structured organic gain region.

The efficiency of the laser is improved further using an active region design as depicted in FIG. 2 for the vertical cavity organic laser device 80. The organic active region 40 (shown in FIG. 1) includes one or more periodic gain regions 100 and organic spacer layers 110 (shown in FIG. 2) disposed on either side of the periodic gain regions 100 and arranged so that the periodic gain regions 100 are aligned with antinodes 103 of the device's standing wave electromagnetic field. This is illustrated in FIG. 2 where the laser's standing electromagnetic field pattern 120 in the organic active region 40 is schematically drawn. Since stimulated emission is highest at the antinodes 103 and negligible at nodes 105 of the electromagnetic field, it is inherently advantageous to form the active region 40 as shown in FIG. 2. The organic spacer layers 110 do not undergo stimulated or spontaneous emission and largely do not absorb either the laser emission 70 or the pump beam 60 wavelengths. An example of a spacer layer 110 is the organic material 1,1-Bis-(4-bis(4-methyl-phenyl)-amino-phenyl)-cyclohexane (TAPC). TAPC works well as the spacer material since it largely does not absorb either the laser emission 70 or the pump beam 60 energy and, in addition, its refractive index is slightly lower than that of most organic host materials. This refractive index difference is useful since it helps in maximizing the overlap between the electromagnetic field antinodes and the periodic gain region(s) 100. As will be discussed below with reference to the present invention, employing periodic gain region(s) 100 instead of a bulk gain region results in higher power conversion efficiencies and a significant reduction of the unwanted spontaneous emission. The placement of the periodic gain region(s) 100 is determined by using the standard matrix method of optics (Corzine et al. IEEE Journal of Quantum Electronics, Volume 25, No. 6, June 1989). To get good results, the thicknesses of the periodic gain region(s) 100 need to be at or below 50 nm in order to avoid unwanted spontaneous emission.

Figure 3:
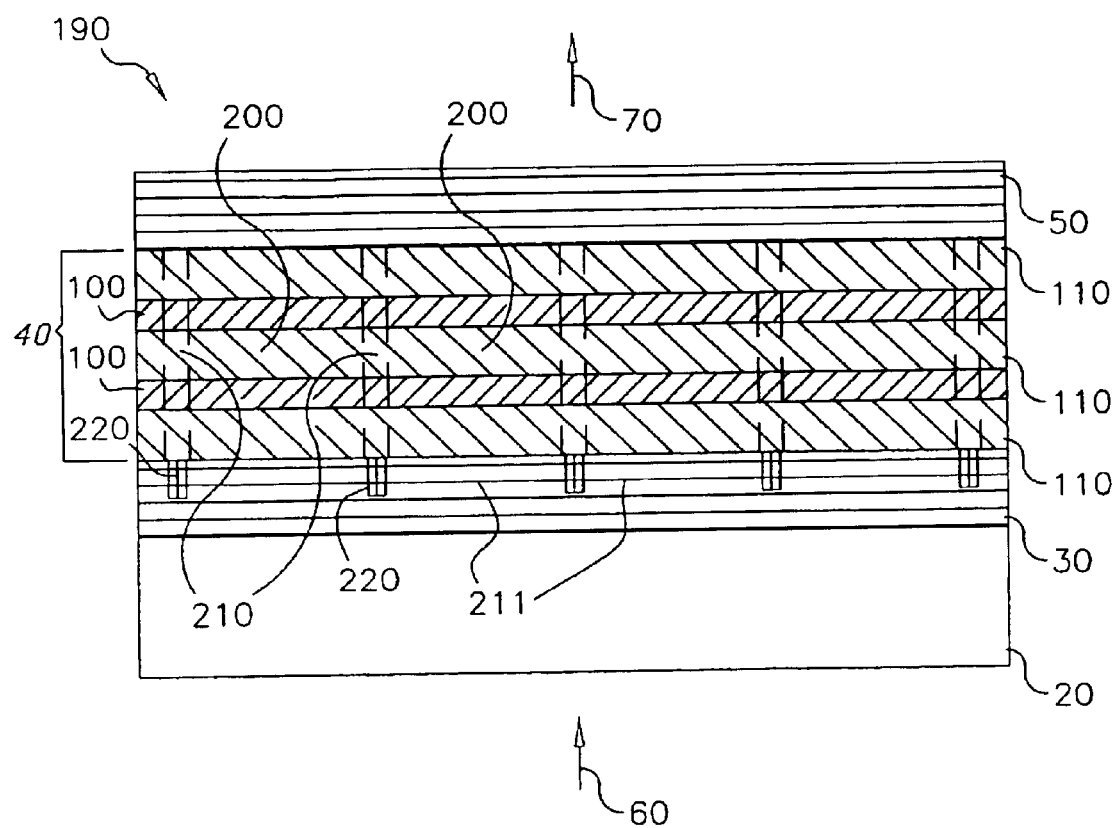
FIG. 3 is a cross-section side view schematic of an optically pumped two-dimensional phase-locked organic vertical cavity laser array device.

The laser can be increased in area while maintaining a degree of spatial coherence by utilizing the phase-locked organic laser array device 190 as depicted in FIG. 3. In order to form a two-dimensional phase-locked organic laser array device 190, organic laser cavity devices 200 separated by inter-pixel regions 210 need to be defined on the surface of the VCSEL. To obtain phase locking, intensity and phase information must be exchanged amongst the organic laser cavity devices 200. This is best obtained by weakly confining the laser emissions to the device regions by either small amounts of built-in index or gain guiding, e.g. by modulating the reflectance of one of the mirrors. In a preferred embodiment the reflectance modulation was affected by patterning and forming an etched region 220 in the bottom dielectric stack 30, using standard photolithographic and etching techniques, thus forming a two-dimensional array of circular pillars 211 on the surface of the bottom dielectric stack 30. The remainder of the organic laser microcavity device structure is deposited upon the patterned bottom dielectric stack 30 as described above. In a preferred embodiment, the shape of the laser pixels is circular; however, other pixel shapes are possible, such as rectangular, for example. The inter-pixel spacing is in the range of 0.25 to 4 μm. Phase-locked array operation also occurs for larger inter-pixel spacings; however, it leads to inefficient usage of the optical-pumping energy. The etch depth is preferred to be from 200 to 1000 nm deep to form etched region 220. By etching just beyond an odd number of layers into the bottom dielectric stack 30, it is possible to affect a significant shift of the longitudinal mode wavelength in the etched region away from the peak of the gain media. Hence, lasing action is prevented and spontaneous emission is significantly reduced in the inter-pixel regions 210. The end result of the formation of etched region 220 is that the laser emission is weakly confined to the organic laser cavity devices 200, no lasing originates from the inter-pixel regions 210, and coherent phase-locked laser light is emitted by the phase-locked organic laser array device 190.

Figure 4:
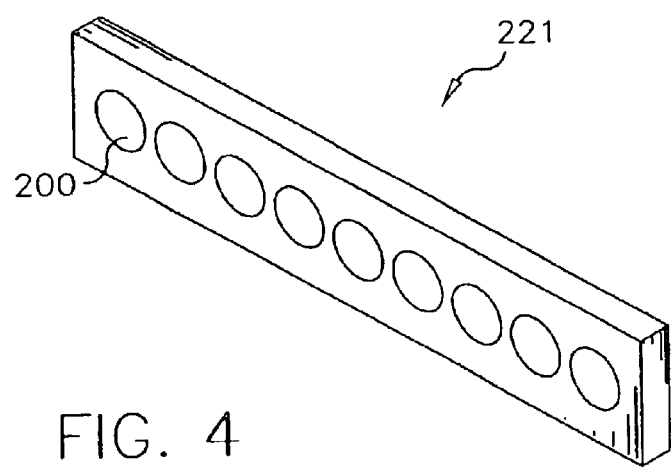
FIG. 4 shows an organic laser cavity structure made in accordance with the present invention in which a one-dimensional arrangement of organic laser cavity devices is depicted.

An organic laser cavity structure is a predetermined arrangement of a plurality of organic laser cavity devices 200. FIG. 4 shows a one-dimensional organic laser cavity structure 221. The one-dimensional organic laser cavity structure has a linear arrangement of the organic laser cavity devices 200. It is to be understood that the organic laser cavity devices 200 that comprise elements of the structure can be a variety of shapes, e.g., rectangular, triagonal, etc. other than the circular shapes depicted. FIG. 4 is just one example of an organic laser cavity structure wherein the arrangement of the organic laser cavity devices 200 is geometrically defined. Geometrically defined means a regular repetition of a pattern. In this case, individual organic laser cavity devices 200 are repeated along the length of the one-dimensional organic laser cavity structure 221.

Figure 5:
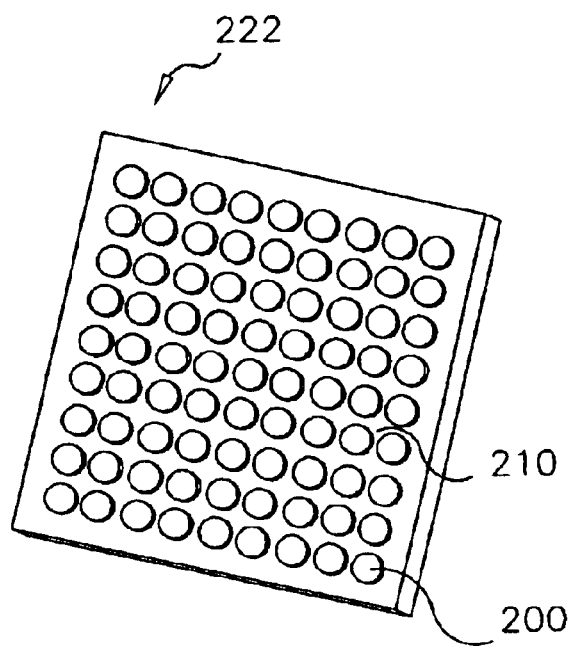
FIG. 5 shows an organic laser cavity structure made in accordance with the present invention in which a two-dimensional arrangement of organic laser cavity devices is depicted.

FIG. 5 shows an organic laser cavity structure made in accordance with the present invention in which a two-dimensional arrangement of organic laser cavity devices is depicted. Such a two-dimensional organic laser cavity structure 222 is formed by fabricating organic laser cavity devices 200 in a regular pattern that extends in 2 dimensions. Fabrication of such devices is well known to those who are skilled in the art. The inter-pixel regions 210 generally consist of non-lasing portions of the structure that separate the organic laser cavity devices 200.

Applications of such one-dimensional organic laser cavity structures 221 and two-dimensional organic laser cavity structures 222 include line and area photo-activated printing processes, line and area emissive displays, and the like. The regular repetition of the light emitting organic laser cavity devices 200 as a consequence of the fabrication process produces an exposure device for printing and display applications. The spacing of the organic laser cavity devices 200 in such structures is dictated by the resolution requirements of the application. For example, in a printer application, the organic laser cavity devices 200 may be circular with diameters of approximately 20 to 50 micrometer, while the spacing between such organic laser cavity devices 200 (the inter-pixel regions 210) may be of comparable distances. Although not depicted, an arrangement whereby the diameter of the organic laser cavity devices 200 varies within the array is also considered an embodiment of the present invention.

Figure 6:
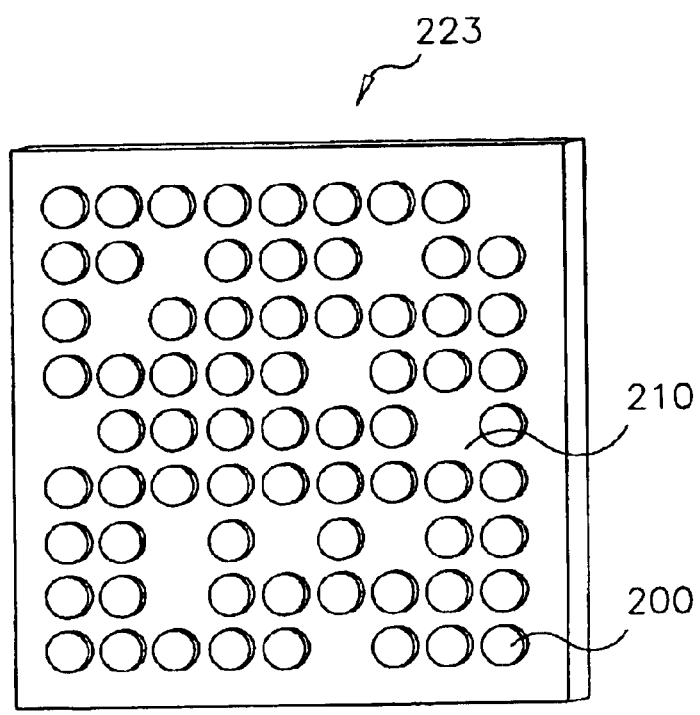
FIG. 6 shows an organic laser cavity structure made in accordance with the present invention in which a two-dimensional substantially random arrangement of organic laser cavity devices is depicted.

FIG. 6 shows an organic laser cavity structure made in accordance with the present invention in which a two-dimensional substantially random arrangement, of organic laser cavity devices 223 is depicted. Such a substantially random two-dimensional organic laser cavity structure 223 contains organic laser cavity devices 200 fabricated in accordance with the descriptions of the devices in FIGS. 1–3. The substantially random two-dimensional organic laser cavity structure 223 is best described as a random placement of single organic laser cavity devices 200 in an area. Although not depicted, an arrangement whereby the diameter of the organic laser cavity devices 200 varies in a substantially random fashion within the array is also considered an embodiment of the present invention. Such substantially random two-dimensional organic laser cavity structures 223 have application in a number of areas including the encryption of information and the display of images.

Figure 7:
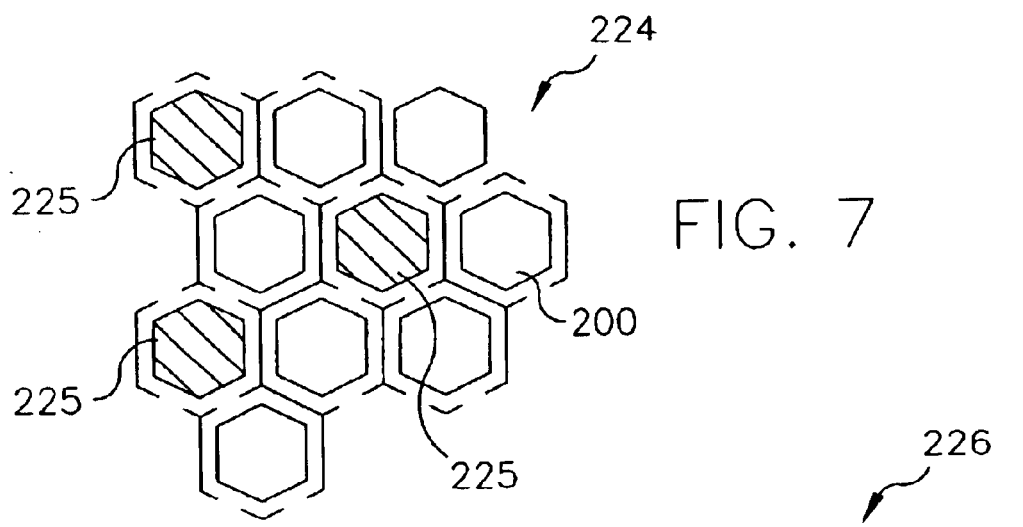
FIG. 7 is a top view schematic of an organic laser cavity structure made in accordance with the present invention in which a two-dimensional hexagonal arrangement of organic lasers cavity devices is depicted.

FIG. 7 is a top view schematic of an organic laser cavity structure made in accordance with the present invention in which a two-dimensional hexagonal arrangement of organic laser cavity devices is depicted. Such a hexagonal two-dimensional organic laser cavity structure 224 contains organic laser cavity devices 200 fabricated to produce the closest space-packing array in 2 dimensions. The advantages of such an array include the delivery of optical radiation with high power density. The high power density is achieved from the closest space-packing nature of the hexagonal arrangement. FIG. 7 depicts 3 emitting organic laser cavity devices 225. Other packing arrangements may be implemented.

Figure 8:
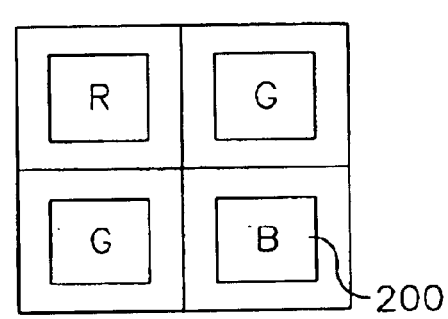
FIG. 8 shows an organic laser cavity structure made in accordance with the present invention in which a two-dimensional Bayer pattern arrangement of organic laser cavity devices is depicted.

FIG. 8 shows an organic laser cavity structure made in accordance with the present invention in which a two-dimensional Bayer pattern arrangement of organic laser cavity devices 226 is depicted. Such a Bayer two-dimensional organic laser cavity structure 226 produces a multiwavelength light output, where the laser light emission is designed to occur at discrete wavelengths in the red (R), green (G), and blue (B) regions of the optical spectrum. The red region of the optical spectrum approximately corresponds to the wavelength range of 600–650 nm. The green region of the optical spectrum approximately corresponds to the wavelength range of 500–550 nm, and the blue region of the optical spectrum approximately corresponds to the wavelength range of 450–500 nm. With the proper design of the organic laser cavity device 200, the light output wavelength can be specified throughout the visible optical spectrum (approximately 450–700 nm). It is to be understood that different wavelength pump beam light can be used to produce a substantially single wavelength output. This can be accomplished through the proper design of the bottom dielectric stack 30 and the top dielectric stack 50 materials and thicknesses, the choice of the organic active region 40 materials, and the dimensions of organic laser cavity device 200. Alternatively, single wavelength pump beam light can produce multiple substantially different wavelength outputs.

Again, this is accomplished by design of the various organic laser cavity devices 200 in the structure. It is also to be understood that any of the organic laser cavity structures can be designed and fabricated so as to produce a multiwavelength light output suitable for the application at hand. In the case of the Bayer two-dimensional organic laser cavity structure 226 there exists an overweighting of the green light output channel in a 2:1 ratio relative to the red and blue light output channels. This structure is advantaged for example, in applications where direct one-to-one illumination of the pixels of a typical CCD optical detector array is desired. The Bayer pattern is typically employed in color-filter arrays that provide colo sensitivity for CCD and CMOS optical detectors (not shown).

Figure 9:
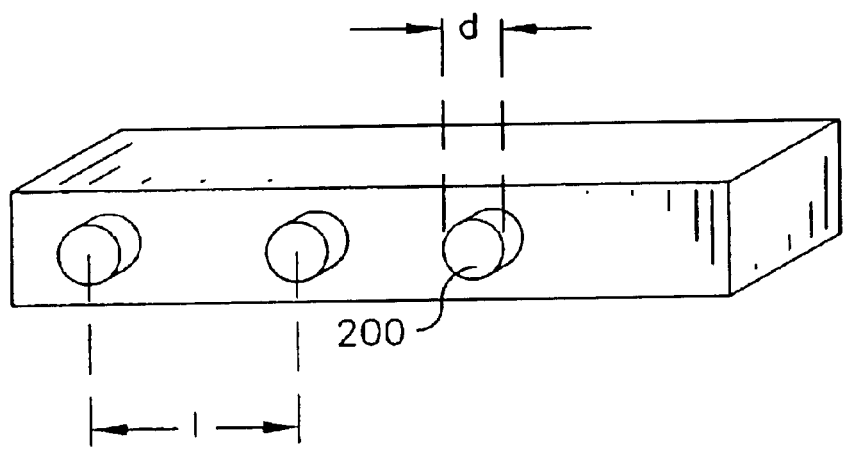
FIG. 9 shows an organic laser cavity structure made in accordance with the present invention in which a one-dimensional or linear arrangement of organic laser cavity devices is depicted and in which the spatial relationship between organic laser cavity devices is depicted.

FIG. 9 shows an organic laser cavity structure made in accordance with the present invention in which a one-dimensional or linear arrangement of organic laser cavity devices 200 is depicted and in which the spatial relationship between organic laser cavity devices 200 is shown. The spatial relations are defined as d=the diameter of the organic laser cavity device 200, and 1=the center-to-center distance of separation between the organic laser cavity devices 200. These two parameters can be used to control the output characteristics of the laser light output. For example, for organic laser cavity structures fabricated with organic laser cavity devices 200 designed with substantially identical wavelength outputs, phase-locking of the organic laser cavity devices 200 is strongly dependent upon the parameters d and 1. A preferred embodiment for the production of phase-locked laser light output has d=3 to 5 $\mu$m and 1=3.25 to 9 $\mu$m. As mentioned previously, greater separations of the organic laser cavity devices 200 leads to a loss of phase-locking and decrease of light utilization efficiency, due to the increase in the area between organic laser cavity devices 200. The primary benefit of such phase-locking is that it produces a coherent addition of the optical light power of the individual organic laser cavity devices 200. In this manner, the power output of the organic laser cavity structure can be increased. In some applications, complete incoherence between organic laser cavity devices 200 is desired; each organic laser cavity device 200 acts as an independent laser. In this manner, dissimilar laser light output phases from the organic laser cavity devices 200 could be accomplished. In this case, the independence of the individual organic laser cavity devices 200 can be accomplished by specifying 1>9 $\mu$m where d=3–5 $\mu$m. Of course, it is to be understood that many other combinations of these parameters will also produce the desired output. Similarly, control of the degree of coherence among the elements of such an organic laser cavity structure is not limited to structures of one dimension as is well know to those versed in the art. It is also an embodiment of the current invention to consider organic laser cavity structures wherein phase-locked laser light output sub-structures are created within a larger array of elements where the sub-structures are independent with respect to each other. This design facilitates simultaneously tailoring the output organic laser cavity structure to optimize light power and resolution for a variety of applications. In addition, although circular organic laser cavity devices 200 are depicted in FIG. 9, other geometric shapes are possible and advantaged in certain applications. For example, as discussed in Wilmsen et al., *Vertical-Cavity Surface-Emitting Lasers*, Cambridge University Press, Cambridge, 2001, rectangular organic laser cavity devices 200 with appropriate dimensions can be used to produce polarized laser light emission from an organic laser cavity structure.

Figure 10:
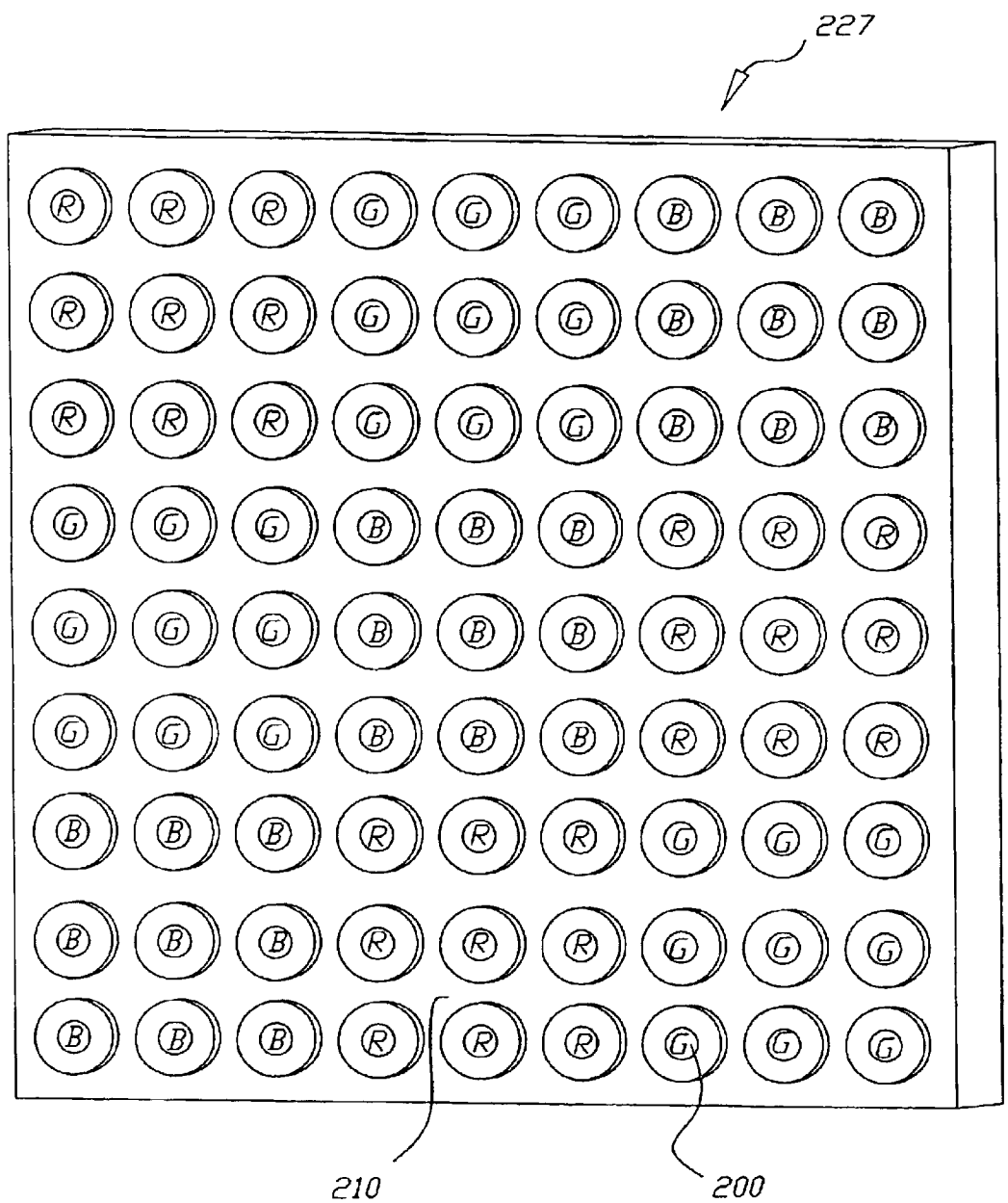
FIG. 10 depicts an organic laser cavity structure in which sub-arrays of different wavelength organic laser cavity devices are fabricated.

FIG. 10 depicts an organic laser cavity structure in which sub-structures of different wavelength organic laser cavity devices are fabricated. Such a multiwavelength organic laser cavity structure 227 has sub-structures of 3×3 red (r), green (g), and blue (b) regions (not shown). As previously discussed, these may be phase-locked with each other, or not, depending on the requirements of the application. The control over the phase-locking is obtained by varying the distance parameters displayed in FIG. 9.

Figure 11:
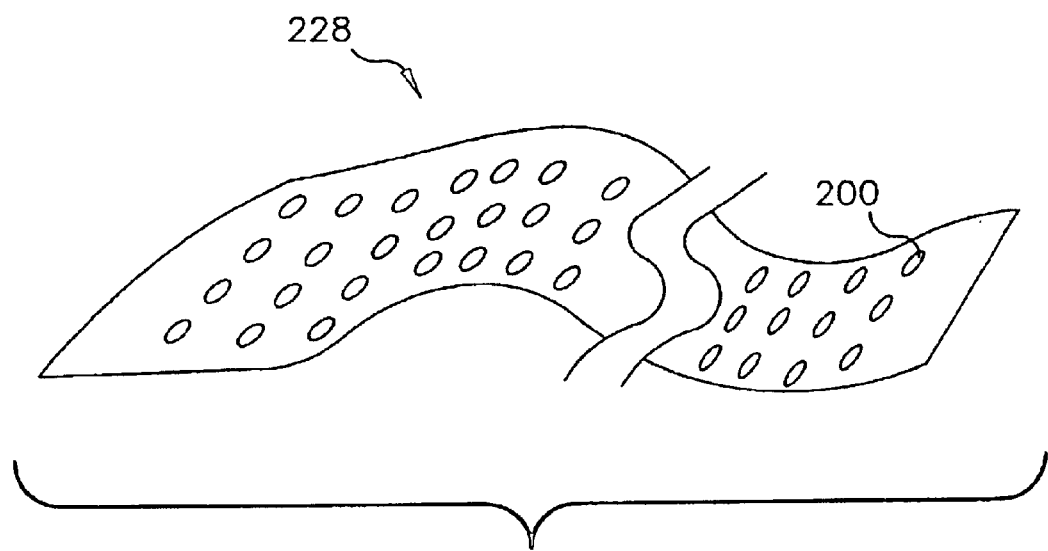
FIG. 11 shows an organic laser cavity structure made in accordance with the present invention in which the structure is fabricated on a flexible support.

FIG. 11 shows an organic laser cavity structure made in accordance with the present invention in which the structure is fabricated on a flexible support. Flexible organic laser cavity structures 228 can be produced, because of the relaxed substrate requirements for organic laser cavities as previously mentioned. Such flexible organic laser cavity structures 228 offer many advantages in that the structure can be lightweight and made to conform to a variety of non-planar surfaces. Additionally, the spatial relationship between organic laser cavity devices 200 may be affected by producing such devices on a flexible substrate. In this way the spatial relationship among the plurality of organic laser cavity devices changes with respect to each other. Stretching a flexible substrate may be used to alter the degree of coherence among organic laser cavity devices 200. It is to be understood that any of the organic laser cavity structures features (multiwavelength, control of coherence among elements, etc.) can be realized in combination with flexible organic laser cavity structures 228.

Figure 12:
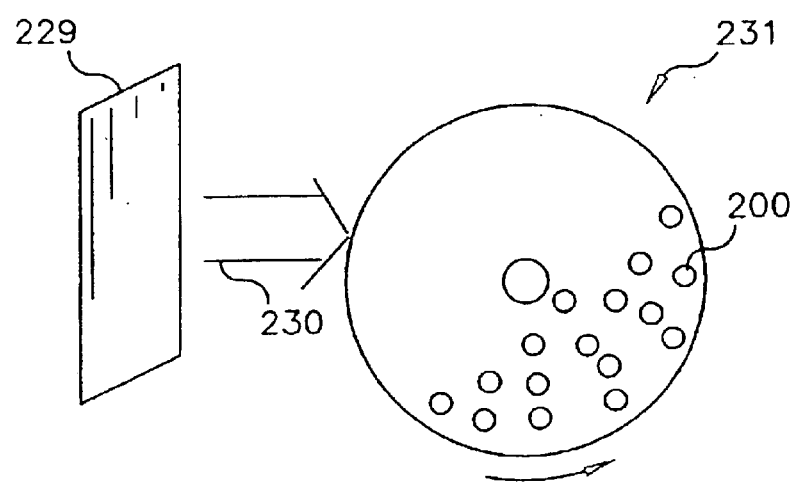
FIG. 12 shows an organic laser cavity structure made in accordance with the present invention in which a uniform light source illuminates the organic laser cavity in a manner that causes a time-dependent light output.

FIG. 12 shows an organic laser cavity structure made in accordance with the present invention in which a light source 229, such as from a plurality of LEDs, illuminates the organic laser cavity structure in a manner that causes a time-dependent light output. The illuminant 230, is directed at the organic laser cavity structure 231 in order to optically excite the laser cavities. Such a time-dependent organic laser cavity structure 231 can be realized in a number of ways. In this case, the illuminant 230 optically pumps a rotating time-dependent organic light cavity structure 231. The organic laser cavity structure is fabricated such that a non-uniform pattern of organic laser cavity devices 200 exist on the substrate surface. The rotation of the organic laser cavity structure 231 causes a time-dependent output to be produced. Equivalently, a fixed organic laser cavity structure 231 could be optically pumped by a time-varying non-uniform light source to produce such an output.

Moreover, the light source 229 may include a single wavelength pump beam light that produces a substantially singular wavelength laser output; or substantially different wavelength pump beam light that produces a single wavelength laser output; or a substantially different wavelength pump beam light that produces multiple substantially different wavelength outputs.

Figure 13:
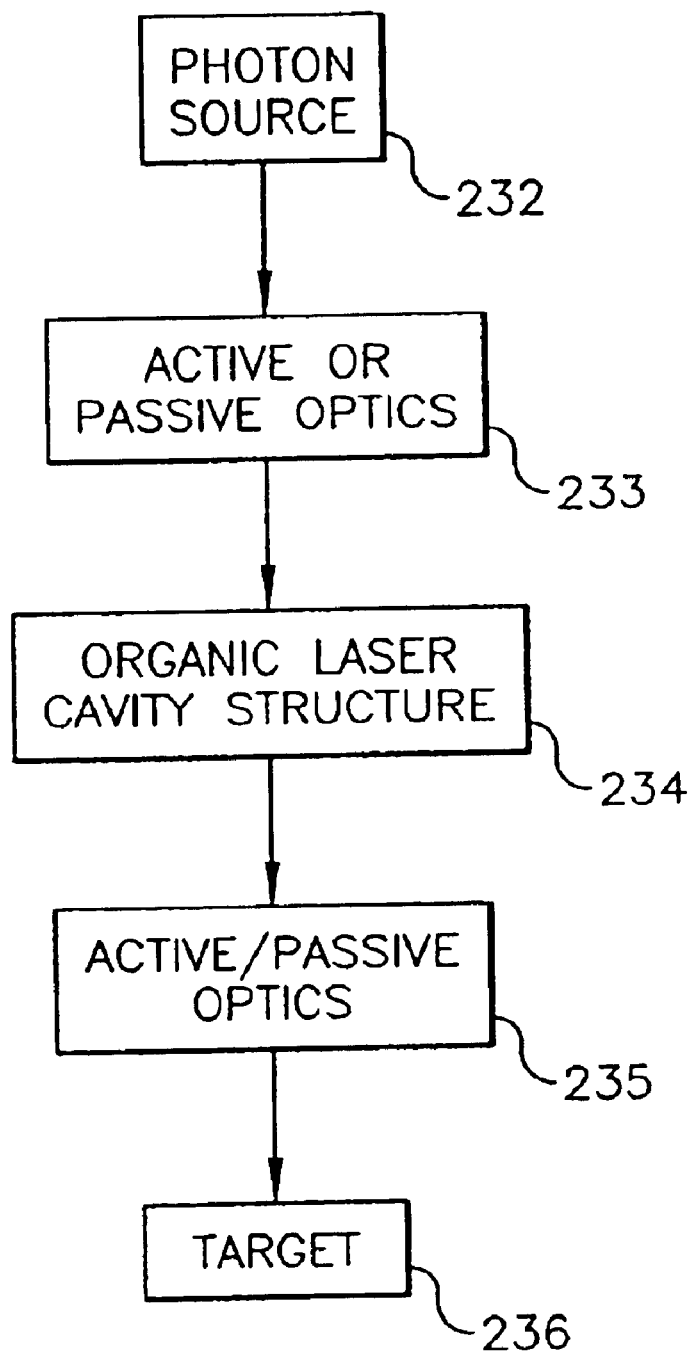
FIG. 13 depicts the method directing light from an organic laser cavity structure made in accordance with the present invention onto a target.

FIG. 13 depicts in block diagram form, the method for directing light from a photon source that provides optical pumping onto an organic laser cavity structure and directs laser light output onto a target. Light is produced in step 232 that provides the means to optically excite the organic laser cavity structure. A wide range of possible sources are available for use in pumping the organic laser cavity structure; this is a consequence of the low power thresholds for lasing from organic laser cavity devices 200. For example an array of light emitting diodes (inorganic or organic) may be employed in this capacity. Light is directed to the organic laser cavity structure in step 233. Various means exist to direct and affect the pump light; for example, lenses and mirrors may be used. These optics may be described as either active or passive. Lenses, filters, and mirrors are examples of passive optical components. They can be used to alter the spatial distribution, optical intensity, polarization, etc. of the pump light. Active optical components can include various optical modulators (electro-optic, acousto-optic) that can be used to alter the intensity, exposure time, polarization, or spatial distribution of the incident pump light. The organic laser cavity structure, described in step 234, receives the pump light and produces laser light in response to the input pump light. The exact form of the laser light output from step 234 is dictated by the features of the organic laser cavity structure as described in the various embodiments above. The laser light produced in step 234 is directed using the elements in step 235 towards a target. Like step 233, these elements can include lenses, mirrors, modulators and the like, that are used to alter the intensity, exposure time, polarization, and spatial distribution of the laser light. Additionally, the phase of the light emitted by the organic laser cavity structure in step 234, may be modulated in its phase so as to affect phase of the output beams directed to a target. Step 235 provides the means to direct and control the output of the organic laser cavity structure onto its intended target. The output of the organic laser cavity structure can include single and multiple wavelengths of optical radiation. Step 236 includes the various forms of the target itself. These targets can include such objects as a light sensitive material, a receiver or detector for optical radiation-based communication; or locations on objects for the purpose of marking an object, for the purpose of scanning an object to obtain its spatial dimensions, for the purpose of obtaining spatially encoding information for authentication, or for the purpose of spectral analysis of an object. Light sensitive materials may include photographic or electro-photographic materials, receiver layers for the ablation of a dye or other material onto a receiver material.

The invention has been described with reference to a preferred embodiment; however, it will be appreciated that variations and modifications can be effected by a person of ordinary skill in the art without departing from the scope of the invention.

PARTS LIST 10 vertical cavity organic laser device
20 substrate
30 bottom dielectric stack
40 organic active region
50 top dielectric stack
60 pump beam
70 laser emission
80 vertical cavity organic laser device
100 periodic gain regions
103 antinodes
105 electromagnetic field nodes
110 organic spacer layers
120 electromagnetic field pattern
190 phase-locked organic laser array device
200 organic laser cavity device
220 inter-pixel regions
211 circular pillars
220 etched region
221 one-dimensional organic laser cavity structure
222 two-dimensional organic laser cavity structure
223 substantially random two-dimensional organic laser cavity structure
224 hexagonal two-dimensional organic laser cavity structure
225 emitting organic laser cavity device
226 Bayer two-dimensional organic laser cavity structure
227 multiwavelength organic laser cavity structure
228 flexible organic laser cavity structures
229 light source
230 illuminant
231 time-dependent organic laser cavity structure
232 photon source step
Parts List—Continued
233 active or passive optics step
234 organic laser cavity structure receives pump light and produces laser light step
235 active or passive optics step
236 target step

What is claimed is:

1. An organic laser cavity structure, comprising:
   a) a plurality of organic laser cavity devices, each organic laser cavity device characterized by:
      i) a first dielectric stack for receiving and transmitting pump beam light and being reflective to laser light over a predetermined range of wavelengths;
      ii) an organic active region, including one or more periodic gain regions and organic spacer layers disposed on either side of the periodic gain regions, for receiving transmitted pump beam light from the first dielectric stack and for emitting the laser light, and wherein the periodic gain regions are aligned with antinodes of a light source's standing wave electromagnetic field;
      iii) a second dielectric stack for reflecting transmitted pump beam light and laser light from the organic active region back into the organic active region, wherein a combination of the first and second dielectric stacks and the organic active region produces the laser light; and
   b) a predetermined arrangement of the plurality of organic laser cavity devices, such that a desired laser output is obtained.

2. The organic laser cavity structure claimed in claim 1, wherein the arrangement is geometrically defined.

3. The organic laser cavity structure claimed in claim 2, wherein the arrangement is a linear arrangement.

4. The organic laser cavity structure claimed in claim 2, wherein the arrangement is a two-dimensional arrangement.

5. The organic laser cavity structure claimed in claim 2, wherein the arrangement is a substantially random arrangement.

6. The organic laser cavity structure claimed in claim 2, wherein the arrangement is a hexagonal two-dimensional arrangement.

7. The organic laser cavity structure claimed in claim 2, wherein the arrangement is a Bayer pattern arrangement.

8. The organic laser cavity structure claimed in claim 1, wherein the arrangement is defined by a spatial relationship between the plurality of organic laser cavity devices.

9. The organic laser cavity structure claimed in claim 8, wherein the spatial relationship is fixed.

10. The organic laser cavity structure claimed in claim 8, wherein the spatial relationship is variable.

11. The organic laser cavity structure claimed in claim 1, wherein the desired laser output includes dissimilar laser output wavelengths emanating from the plurality of organic laser cavity devices.

12. The organic laser cavity structure claimed in claim 1, wherein the desired laser output includes substantially similar laser output wavelengths emanating from the plurality of organic laser cavity devices.

13. The organic laser cavity structure claimed in claim 1, wherein the desired laser output includes dissimilar laser light output phases of each of the plurality of organic laser cavity devices.

14. The organic laser cavity structure claimed in claim 1, wherein the desired laser output includes substantially similar laser light output phases of each of the plurality of organic laser cavity devices.

15. The organic laser cavity structure claimed in claim 1, wherein the desired laser output includes substantially similar laser light output polarization of each of the plurality of organic laser cavity devices.

16. The organic laser cavity structure claimed in claim 1, wherein the desired laser output includes dissimilar laser light output polarization of each of the plurality of organic laser cavity devices.

17. The organic laser cavity structure claimed in claim 1, wherein the predetermined arrangement is a combination drawn from the group consisting of: geometric arrangement, phase arrangement, wavelength arrangement, polarization arrangement, and spatial arrangement.

18. The organic laser cavity structure claimed in claim 1, wherein the predetermined arrangement is planar.

19. The organic laser cavity structure claimed in claim 1, wherein the predetermined arrangement is non-planar.

20. The organic laser cavity structure according to claim 1 wherein a single wavelength pump beam light produces substantially different wavelength outputs.

21. The organic laser cavity structure claimed in claim 1, wherein a single wavelength pump beam light produces a substantially singular wavelength laser output.

22. The organic laser cavity structure claimed in claim 1, wherein substantially different wavelength pump beam light produces a single wavelength laser output.

23. The organic laser cavity structure claimed in claim 1, wherein substantially different wavelength pump beam light produces multiple substantially different wavelength outputs.

24. The organic laser cavity structure claimed in claim 1, wherein the desired laser output is in a time-dependent relationship with respect to the pump beam light.

25. The organic laser cavity structure claimed in claim 1, wherein a spatial relationship among the plurality of organic laser cavity devices changes with respect to each other.

26. The organic laser cavity structure claimed in claim 1, wherein the predetermined arrangement is formed on a flexible substrate.

27. A method of directing optical radiation at specific target locations, comprising the steps of:
   a) providing an organic laser cavity structure, comprising: a plurality of organic laser cavity devices arranged in a pattern in one or more dimensions, each of the plurality of organic laser cavity devices characterized by a first dielectric stack for receiving and transmitting pump beam light and being reflective to laser light over a predetermined range of wavelengths; an organic active region including one or more periodic gain regions and organic spacer layers disposed on either side of the periodic gain regions, for receiving transmitted pump beam light from the first dielectric stack and for emitting the laser light, and wherein the periodic gain regions are aligned with antinodes of a light source's standing wave electromagnetic field; a second dielectric stack for reflecting transmitted pump beam light and laser light from the organic active region back into the organic active region, wherein a combination of the first and second dielectric stacks and the organic active region produces the laser light; and a predetermined arrangement of the plurality of organic laser cavity devices, such that a desired optical radiation is obtained; and
   b) directing the desired optical radiation at the specific target locations.

28. The method of claim 27, wherein directing optical radiation at specific target locations includes marking an object.

29. The method of claim 27, further comprising exposing a light sensitive material.

30. The method of claim 27, further comprising the step of enabling optical radiation-based communication.

31. The method of claim 27, includes scanning of an object to obtain its spatial dimensions.

32. The method of claim 27, includes conducting spectral analysis of an object.

33. The method of claim 27, includes encoding information for authentication.

34. A method of directing optical radiation at specific target locations, comprising the steps of:
   a) providing an organic laser cavity structure, comprising: a plurality of organic laser cavity devices arranged in a pattern in one or more dimensions, each of the plurality of organic laser cavity devices characterized by a first dielectric stack for receiving and transmitting pump beam light and being reflective to laser light over a predetermined range of wavelengths; an organic active region including one or more periodic gain regions and organic spacer layers disposed on either side of the periodic gain regions, for receiving transmitted pump beam light from the first dielectric stack and for emitting the laser light, and wherein the periodic gain regions are aligned with antinodes of a light source's standing wave electromagnetic field; a second dielectric stack for reflecting transmitted pump beam light and laser light from the organic active region back into the organic active region, wherein a combination of the first and second dielectric stacks and the organic active region produces the laser light; and a predetermined arrangement of the plurality of organic laser cavity devices, such that a multiple wavelength of desired optical radiation is obtained; and
   b) directing the desired optical radiation, having multiple wavelengths, at the specific target locations.

35. The method of claim 34, wherein directing optical radiation at specific target locations includes marking an object.

36. The method of claim 34, further comprising exposing a light sensitive material.

37. The method of claim 34, further comprising the step of enabling optical radiation-based communication.

38. The method of claim 34, includes scanning of an object to obtain its spatial dimensions.

39. The method of claim 34, includes conducting spectral analysis of an object.

40. The method of claim 34, includes encoding information for authentication.

41. A method of directing optical radiation at specific target locations, comprising the steps of:
   a) providing an organic laser cavity structure, comprising: a plurality of organic laser cavity devices arranged in a pattern in one or more dimensions, each of the plurality of organic laser cavity devices characterized by a first dielectric stack for receiving and transmitting pump beam light and being reflective to laser light over a predetermined range of wavelengths; an organic active region including one or more periodic gain regions and organic spacer layers disposed on either side of the periodic gain regions, for receiving transmitted pump beam light from the first dielectric stack and for emitting the laser light, and wherein the periodic gain regions are aligned with antinodes of a light source's standing wave electromagnetic field; a second dielectric stack for reflecting transmitted pump beam light and laser light from the organic active region back into the organic active region, wherein a combination of the first and second dielectric stacks and the organic active region produces the laser light; and a predetermined arrangement of the plurality of organic laser cavity devices, such that multiple distinct phases of desired optical radiation are obtained; and b) directing the desired optical radiation, having multiple distinct phases, at the specific target locations.

42. The method of claim 41, wherein directing optical radiation at specific target locations includes marking an object.

43. The method of claim 41, further comprising exposing a light sensitive material.

44. The method of claim 41, further comprising the step of enabling optical radiation-based communication.

45. The method of claim 41, includes scanning of an object to obtain its spatial dimensions.

46. The method of claim 41, includes conducting spectral analysis of an object.

47. The method of claim 41, includes encoding information for authentication.

48. A method of directing optical radiation at specific target locations, comprising the steps of:

a) providing an organic laser cavity structure, comprising: a plurality of organic laser cavity devices arranged in a pattern in one or more dimensions and that are spaced relative to each other having a variable spatial relationship, each of the plurality of organic laser cavity devices characterized by a first dielectric stack for receiving and transmitting pump beam light and being reflective to laser light over a predetermined range of wavelengths; an organic active region including one or more periodic gain regions and organic spacer layers disposed on either side of the periodic gain regions, for receiving transmitted pump beam light from the first dielectric stack and for emitting the laser light, and wherein the periodic gain regions are aligned with antinodes of a light source's standing wave electromagnetic field; a second dielectric stack for reflecting transmitted pump beam light and laser light from the organic active region back into the organic active region, wherein a combination of the first and second dielectric stacks and the organic active region produces the laser light; and a predetermined arrangement of the plurality of organic laser cavity devices, such that desired optical radiation are obtained; and b) directing the desired optical radiation at the specific target locations.

49. The method of claim 48, wherein directing optical radiation at specific target locations includes marking an object.

50. The method of claim 48, further comprising exposing a light sensitive material.

51. The method of claim 48, further comprising the step of enabling optical radiation-based communication.

52. The method of claim 48, includes scanning of an object to obtain its spatial dimensions.

53. The method of claim 48, includes conducting spectral analysis of an object.

54. The method of claim 48, includes encoding information for authentication.

55. A method of directing optical radiation at specific target locations, comprising the steps of:

a) providing an organic laser cavity structure, comprising: a plurality of organic laser cavity devices arranged in a pattern in one or more dimensions, each of the plurality of organic laser cavity devices characterized by a first dielectric stack for receiving and transmitting pump beam light and being reflective to laser light over a predetermined range of wavelengths; an organic active region including one or more periodic gain regions and organic spacer layers disposed on either side of the periodic gain regions, for receiving transmitted pump beam light from the first dielectric stack, and wherein the periodic gain regions are aligned with antinodes of a light source's standing wave electromagnetic field; a second dielectric stack for reflecting transmitted pump beam light and laser light from the organic active region back into the organic active region, wherein a combination of the first and second dielectric stacks and the organic active region produces the laser light; and a predetermined arrangement of the plurality of organic laser cavity devices, such that a desired optical radiation is obtained; and b) directing the desired optical radiation at the specific target locations by selectively exciting one or more of the plurality of organic laser cavity devices.

56. The method of claim 55, wherein directing optical radiation at specific target locations includes marking an object.

57. The method of claim 55, further comprising exposing a light sensitive material.

58. The method of claim 55, further comprising the step of enabling optical radiation-based communication.

59. The method of claim 55, includes scanning of an object to obtain its spatial dimensions.

60. The method of claim 55, includes conducting spectral analysis of an object.

61. The method of claim 55, includes encoding information for authentication.

* * * * *